(12) United States Patent
Takeuchi

(10) Patent No.: US 7,335,414 B2
(45) Date of Patent: Feb. 26, 2008

(54) PRINTED CIRCUIT BOARD AND CAMERA MODULE

(75) Inventor: Setsu Takeuchi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 11 days.

(21) Appl. No.: 11/293,220

(22) Filed: Dec. 5, 2005

(65) Prior Publication Data

US 2006/0141226 A1    Jun. 29, 2006

(30) Foreign Application Priority Data

Dec. 3, 2004    (JP)    ............................. 2004-351280

(51) Int. Cl.
*H05K 1/03* (2006.01)
*H05K 1/14* (2006.01)
*H01B 17/58* (2006.01)

(52) U.S. Cl. .................. 428/195.1; 174/254; 174/255; 174/262; 174/167; 361/741; 361/751

(58) Field of Classification Search ................ 428/209, 428/195.1; 174/254–255, 262, 167; 361/741, 361/751

See application file for complete search history.

(56) References Cited

U.S. PATENT DOCUMENTS

| | | | | |
|---|---|---|---|---|
| 3,271,214 A | * | 9/1966 | Tabor .......................... | 156/52 |
| 4,687,695 A | * | 8/1987 | Hamby ........................ | 428/192 |
| 5,697,005 A | * | 12/1997 | Kikuchi ....................... | 396/535 |
| 6,542,238 B1 | * | 4/2003 | Tsuboi et al. ................ | 356/401 |
| 6,853,874 B2 | * | 2/2005 | Kawada et al. ............. | 700/213 |
| 6,953,989 B2 | * | 10/2005 | Kiriyama ..................... | 257/668 |
| 6,986,196 B2 | * | 1/2006 | Terui ............................ | 29/740 |
| 2005/0095746 A1 | | 5/2005 | Aoyagi | |

FOREIGN PATENT DOCUMENTS

| | | |
|---|---|---|
| JP | 11-284322 A | 10/1999 |
| JP | 2000-022315 A | 1/2000 |

* cited by examiner

*Primary Examiner*—Cathy F. Lam
(74) *Attorney, Agent, or Firm*—Sughrue Mion, PLLC

(57) ABSTRACT

A printed circuit board has a flexible portion where a covering layer is exposed, and a rigid portion provided by forming a resistant layer on a part of the covering layer. To produce a camera module, a lens unit and a CCD are affixed to the printed circuit board through an adhesive, wherein the CCD is located inside the lens unit. The rigid portion has a top surface that is substantially equal in shape and size to an outline of a bottom surface of the lens unit, so the top surface of the rigid portion serves as a coating area for the adhesive.

8 Claims, 4 Drawing Sheets

PRINTED CIRCUIT BOARD AND CAMERA MODULE

FIELD OF THE INVENTION

The present invention relates to a printed circuit board consisting of a plural number of layers, including a base layer, a wiring layer having a circuit pattern formed thereon and a covering layer that covers the wiring layer, wherein an obverse surface of the printed circuit board is coated with an adhesive for mounting some components thereon. The present invention relates also to a camera module using such a printed circuit board.

BACKGROUND ARTS

As known printed circuit boards, there are flexible printed circuit boards, which are flexible and bendable and consist of a base layer, a wiring layer and a covering layer covering the wiring layer, and rigid printed circuit boards that has a rigid layer formed on the covering layer. There are also flexible rigid printed circuit boards that are partly rigid and partly flexible as a rigid layer is partly formed on a covering layer. The printed circuit boards are coated with an adhesive for mounting appropriate kinds of functional parts thereon.

In the conventional mounting process, a coating sample showing adhesive coating areas on the printed circuit boards is prepared for each worker to coat the printed circuit boards with the adhesive in accordance with the coating sample. Coating with the coating sample is inefficient and increases task time.

SUMMARY OF THE INVENTION

In view of the foregoing, a primary object of the present invention is to provide a printed circuit board that improves workability on mounting some parts thereon, and a camera module that uses the printed circuit board.

To achieve the above and other objects in a printed circuit board comprising a number of layers including a wiring layer formed with a circuit pattern and a covering layer covering the wiring layer, the present invention suggest marking a designated coating area for an adhesive, through which at least a separate component is affixed to the printed circuit board, by differentiating layered structure at least in a border of the coating area.

According to a preferred embodiment, the printed circuit board further comprises a resistant layer formed to cover a part of the covering layer, and the resistant layer is rigid and substantially equal in shape and size to the coating area, to mark the coating area as a rigid portion, whereas other portions exposing the covering layer are flexible.

According to another preferred embodiment, the coating area is marked with perforations which are formed through at least one of the layers.

The perforations are preferably arranged along the border of the coating area, and are formed through at least an outermost one of the layers. By making the outermost layer of a material having a different color from other layers, the border of the coating area becomes more conspicuous.

A camera module of the present invention comprises a lens unit, an imaging device and a printed circuit board, wherein the printed circuit board comprises a number of layers including a wiring layer having a circuit pattern and a covering layer covering the wiring layer, the lens unit and the imaging device being affixed to the printed circuit board through an adhesive that is put on a designated coating area in a surface of the printed circuit board, the coating area being marked by differentiating layered structure of the printed circuit board at least in a border of the coating area.

According to the present invention, an adhesive coating area is marked by differentiating layered structure of the printed circuit board at least at the border of the coating area, so that it is unnecessary for the worker to see the coating sample on coating the printed circuit board with the adhesive in the mounting process. Therefore, workability is improved.

BRIEF DESCRIPTION OF THE DRAWINGS

The above and other objects and advantages will be more apparent from the following detailed description of the preferred embodiments when read in connection with the accompanied drawings, wherein like reference numerals designate like or corresponding parts throughout the several views, and wherein.

DESCRIPTION OF THE PREFERRED EMBODIMENTS

Figure 1:
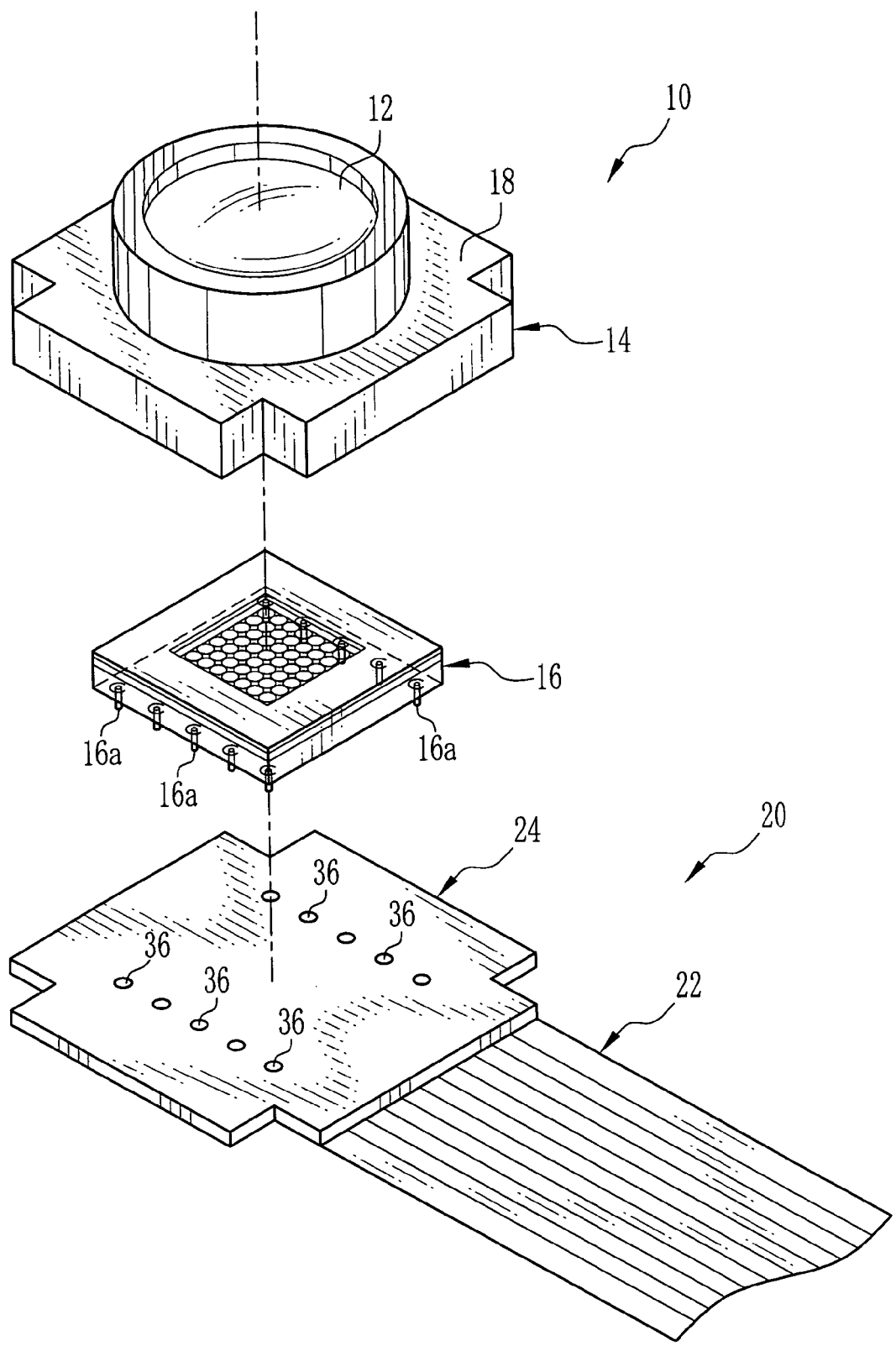
FIG. 1 is an exploded perspective view of a camera module according to an embodiment of the present invention.

FIG. 1 shows a camera module 10 embodying the present invention. The camera module 10 is taking an image signal from an optical image of a subject, which is formed through a taking lens 12. For example, the camera module 10 is applied to a camera phone. The camera module 10 has a lens unit 14 and a charge coupled device (CCD) 16, which are mounted on a printed circuit board 20.

Figure 2:
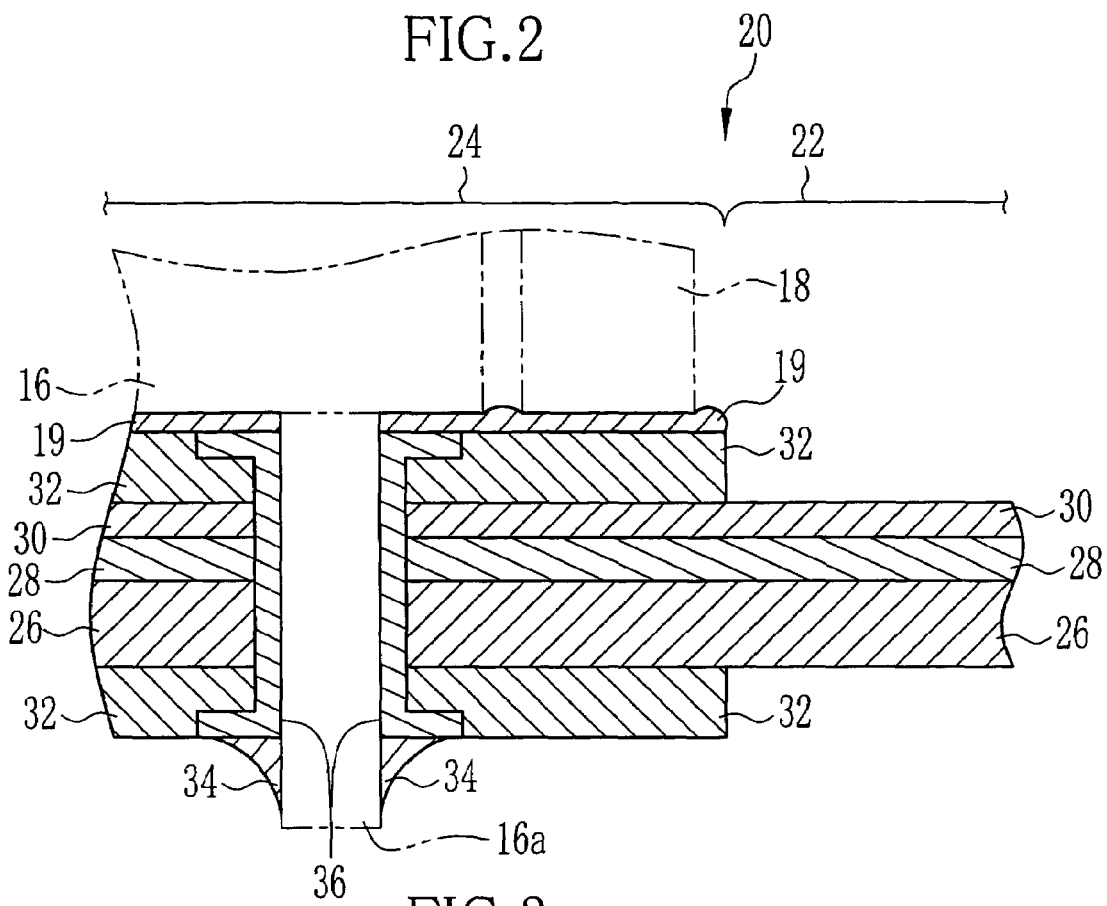
FIG. 2 is a fragmentary section of a printed circuit board according to an embodiment of the present invention.

The lens unit 14 consists of the taking lens 12 and a holding frame 18 having the taking lens 12 fitted on a top portion thereof. The lens unit 14 is placed on the CCD 16, surrounding an outer periphery of the CCD 16 with a bottom portion of the holding frame 18, and the holding frame 18 is affixed at its bottom surface to the printed circuit board 20 through an adhesive 19, as shown in FIG. 2. As a result, the taking lens 12 is fixedly placed over the CCD 16.

As well-known in the art, the CCD 16 has a large number of light receiving elements arranged in a matrix on its top or front surface, and the light receiving elements accumulate electric charges corresponding to the optical image formed thereon, so the electric charges accumulated in the light receiving elements are taken as the image signal. On a bottom or back surface of the CCD 16 are provided connection terminals 16a for inputting drive signals to the CCD 16 and outputting the taken image signal from the CCD 16. Like the lens unit 14, the CCD 16 is also affixed at its bottom surface to the printed circuit board 20 through the adhesive 19.

The printed circuit board 20 has a flexible portion 22 and a rigid portion 24. The rigid portion 24 is for mounting the lens unit 14 and the CCD 16 thereon. The flexible portion 22 is flexible and bendable, and extends to connect the printed circuit board 20 to a not-shown main circuit board of an apparatus to integrate the camera module 10 therein, such as a camera phone. The drive signals are fed from the main circuit board to the CCD 16.

As shown in FIG. 2, the printed circuit board 20 is mainly constituted of a base layer 26 that is brown and formed from polyester and polyimide, a wiring layer 28 formed atop the base layer 26, and a transparent covering layer 30 that protects the wiring layer 28. The wiring layer 28 is provided with a circuit pattern made of copper foil. In the flexible portion 22, the covering layer 30 and the base layer 26 are exposed.

In the rigid portion 24, on the other hand, resistant layers 32 are formed atop the covering layer 30 and under the base layer 26. The resistant layers 32 are formed by coating the covering layer 30 and the base layer 26 with a green heat resistant material, to ensure thermo-stability of the printed circuit board 20 as well as to prevent unnecessary spreading of solder 34 on soldering the CCD 16, as set forth later.

The rigid portion 24 has through-holes 36 that are formed through the printed circuit board 20. The through-holes 36 are made conductive by copper-plating or the like, and are respectively connected to wires on the wiring layer 28. The connection terminals 16a of the CCD 16 are put through the through-holes 36 and are soldered on the back or bottom side of the printed circuit board 20, providing electric contact of the CCD 16 and the printed circuit board 20.

Figure 3:
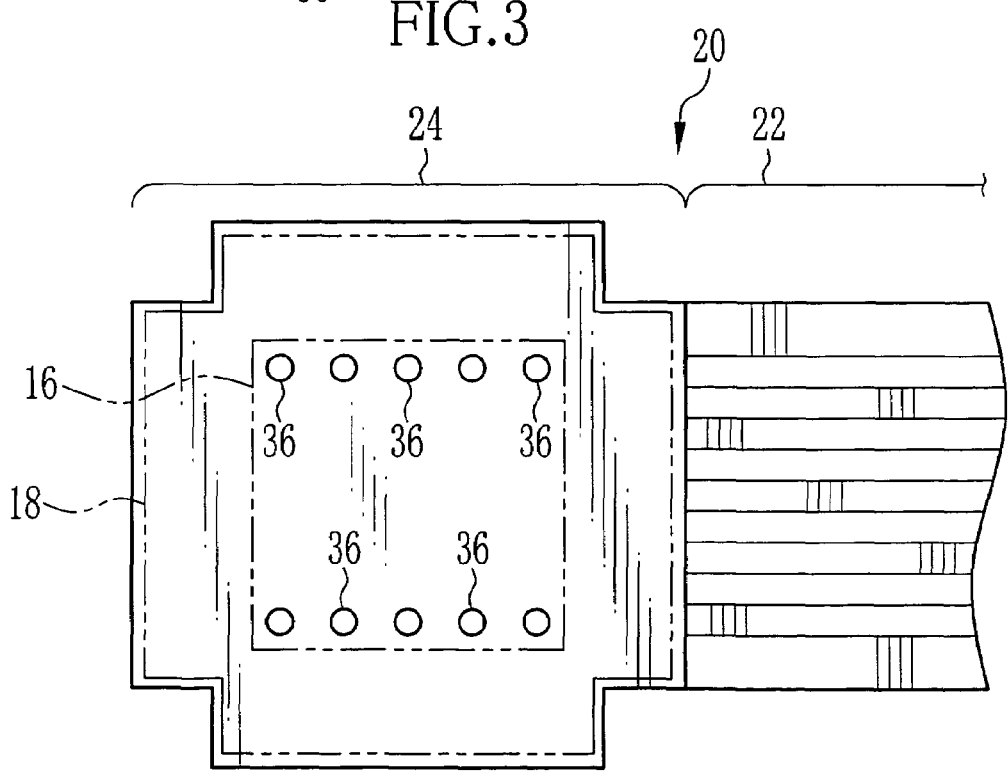
FIG. 3 is a top plan view of the printed circuit board of FIG. 2.

As shown in FIG. 3, the top surface of the rigid portion 24 is made to have a shape and a size, which are substantially equal to ones of the outline of the bottom surface of the holding frame 18 of the lens unit 14. This configuration permits using the top surface of the rigid portion 24 as a coating area for the adhesive 19 for affixing the CCD 16 and the lens unit 14 to the rigid portion 24.

The camera module 10 as configured above is manufactured in the following manner. The worker coats the printed circuit board 20 with the adhesive 19 in the predetermined coating area that corresponds to the whole top surface of the rigid portion 24 in this embodiment. Thereafter, the CCD 16 and the lens unit 14 are affixed to the top surface of the rigid portion 24, and the connection terminals 16a of the CCD 16 are connected to the through-holes 36 by soldering.

Because the rigid portion 24 is differentiated from the flexible portion 22 by providing the resistant layer 32 on the covering layer 30 in the rigid portion 24, while the covering layer, 30 is exposed in the flexible portion 22, it is easy for the worker to discriminate the coating area from other portions. So the work efficiency is improved as compared to the conventional cases where the worker must do coating while checking coating samples that show designated coating areas. Moreover, because the resistant layer 32 is formed from a green resistant material, the rigid portion 24 looks green. On the other hand, the flexible portion 22 looks brown because the brown base layer 26 and the wiring layer 28 made from copper foil are visible through the transparent covering layer 30 in the flexible portion 22. Therefore, the rigid portion 24 as the coating area is marked more conspicuously, contributing to the work efficiency.

Indeed it is possible to paint the coating area in a different color to discriminate it from other portions, but this method needs a painting process or device in addition to conventional manufacturing devices. The additional equipment raises the manufacturing cost. On the contrary, the printed circuit board of the present invention can be manufactured without the need for reconstituting the manufacturing equipment for the conventional printed circuit board.

The present invention is not to be limited to the above embodiment wherein the coating area is marked by providing the rigid portion in correspondence with the coating area while making other portions flexible. For example, as shown in a printed circuit board 40 of FIG. 4, a coating area of an adhesive may be marked by forming perforations 42 along a border of the coating area, through a resisting layer 32. In the following embodiment, equivalent parts will be designed by the same reference numerals as the first embodiment, so the description of these parts will be omitted to avoid redundancy.

Figure 4A:
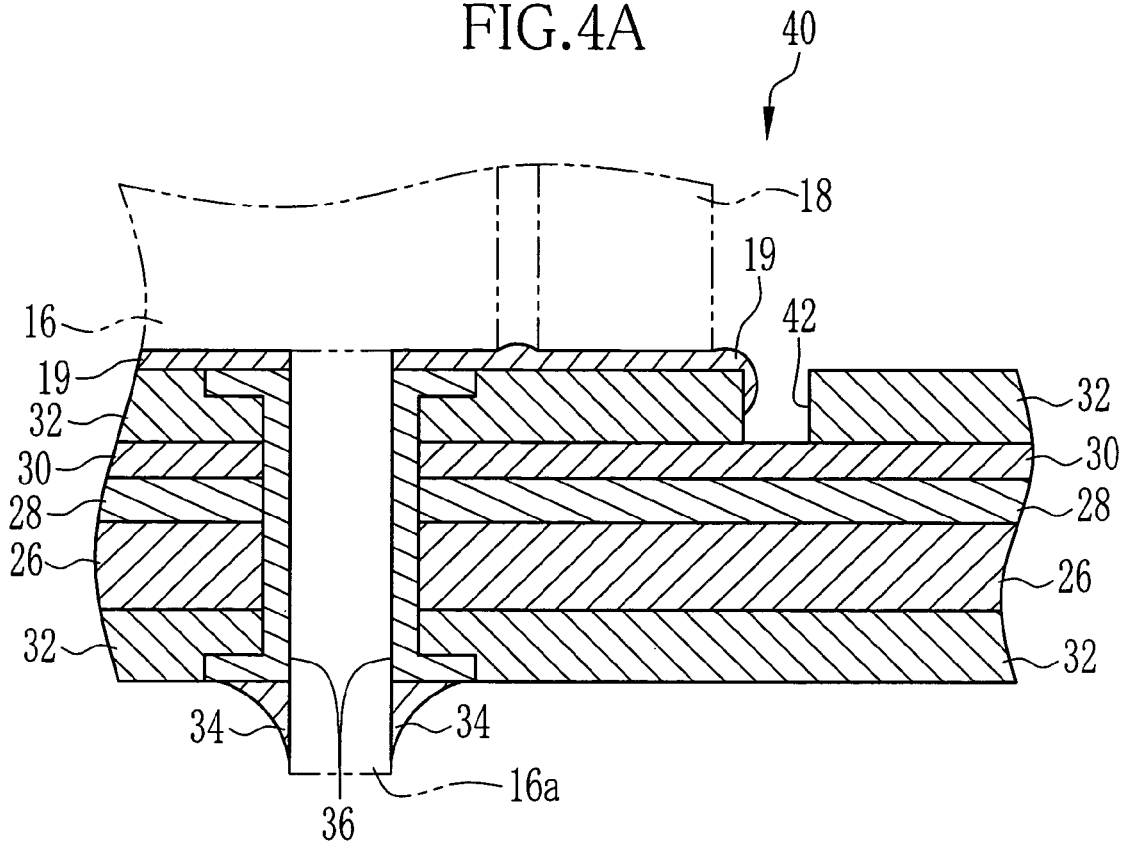
FIG. 4A is a fragmentary section of a printed circuit board according to a second embodiment of the present invention.
Figure 4B:
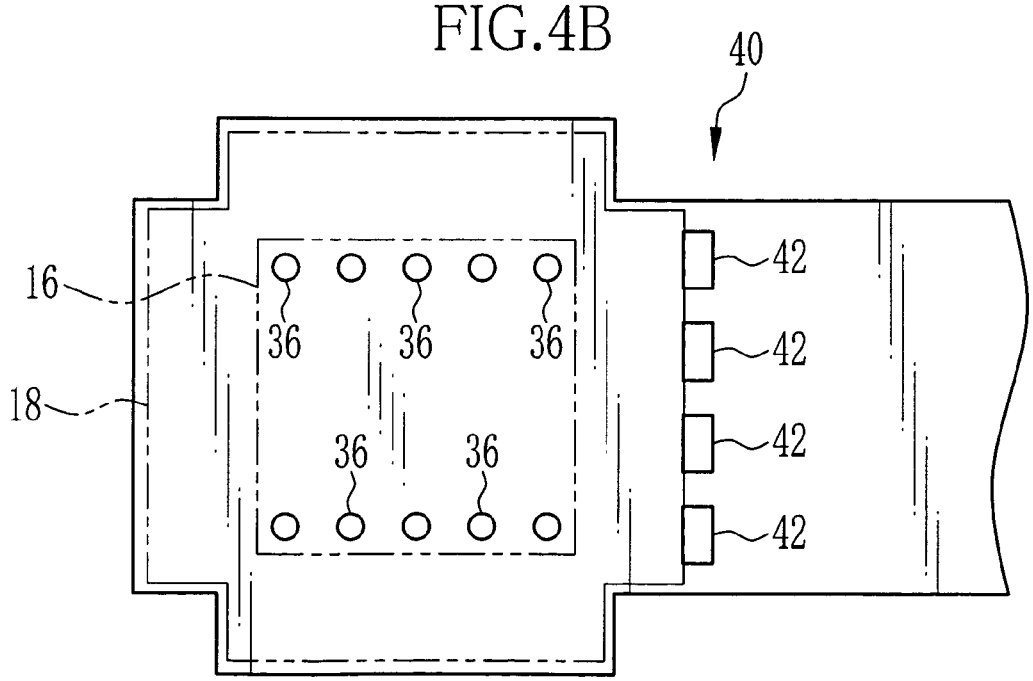
FIG. 4B is a top plan view of the printed circuit board of FIG. 4A.

As shown in FIG. 4A, the printed circuit board 40 has the perforations 42 formed through the resistant layer 32, so a covering layer 30 under the resistant layer 32 is exposed through the perforations 42. In the present embodiment, the resistant layer 32 is made of a green material, the covering layer 30 is transparent, and a base layer 26 is brown. As a result, the printed circuit board 40 looks brown inside the perforations 42 and green outside the perforations 42. Since the perforations 42 are formed along the border of the coating area for the adhesive 19, as shown in FIG. 4B, the coating area is marked so clearly that the work efficiency is improved.

Figure 5A:
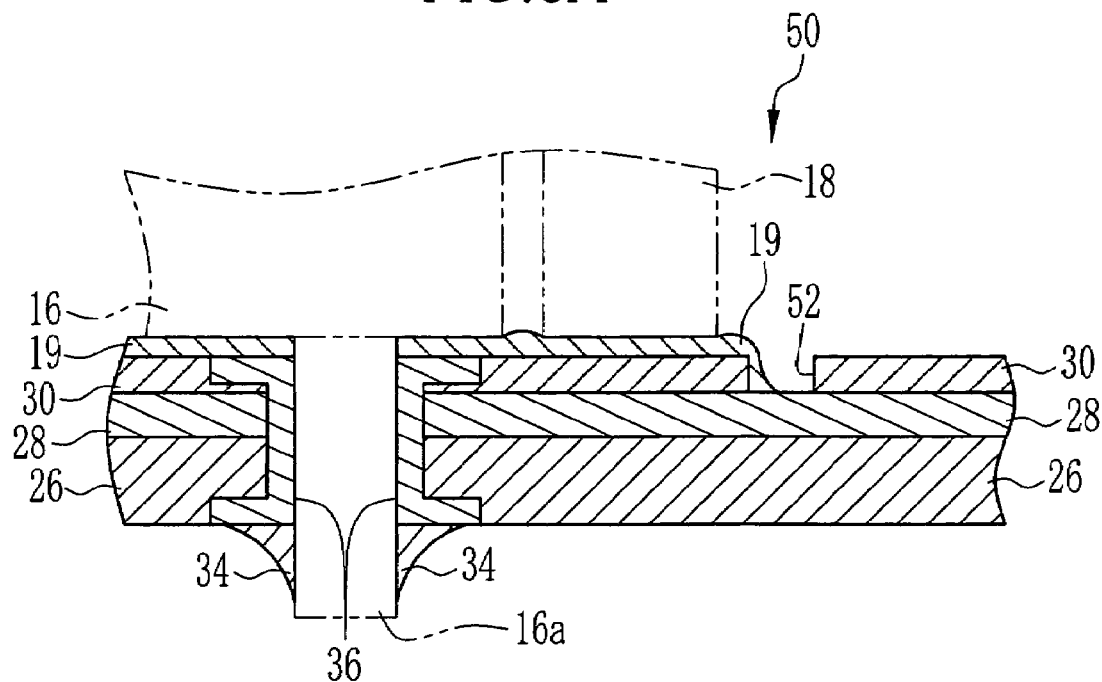
FIG. 5A is a fragmentary section of a printed circuit board according to a third embodiment of the present invention.
Figure 5B:
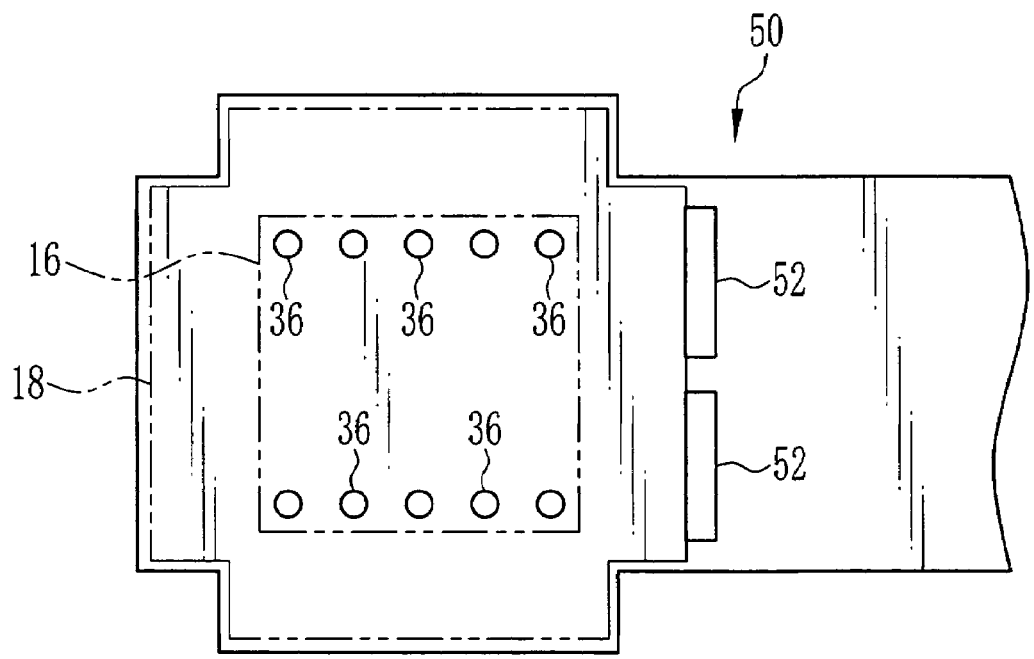
FIG. 5B is a top plan view of the printed circuit board of FIG. 5A.

It is also possible to form perforations 52 through a covering layer 30 to mark a coating area for an adhesive 19, as shown in FIG. 5. A printed circuit board 50 of this embodiment is not provided with a resistant layer, so the adhesive 19 is put on the covering layer 30 to attach another component to the printed circuit board 50. In the printed circuit board 50, the covering layer 30 is made of a yellow material. Since the perforations 52 are formed along a border of the coating area through the covering layer 30 to expose a brown wiring layer 28 as placed under the covering layer 30, the perforations 52 looks brown inside the perforations 52 while other portions looks yellow. Thus, the coating area is marked clearly to improve the work efficiency.

As described with reference to FIGS. 4 and 5, the same effect is achieved by indicating the coating area with the perforations, as in the first embodiment. Besides that, because the adhesive flows into recesses formed by the perforations, mounting strength on the printed circuit board is improved. The shape and number of the perforations may be defined appropriately. For example, the perforations can be round. Moreover, the perforations can be formed through any of the layers constituting the printed circuit board. That is, the perforations may be formed not only through the resistant layer or the covering layer, but also through the wiring layer or the base layer. It is also possible to form perforations that go through all layers of a printed circuit board.

Furthermore, with respect to such a flexible printed circuit board that consists of a base layer, a wiring layer and a covering layer, it is possible to draw a border line of an adhesive coating area on a covering layer with a resistant material, to mark the adhesive coating area. Because such coating of the resistant layer can be done with use of manufacturing devices for conventional printed circuit boards, this embodiment can achieve the same effect as the above embodiments without an additional manufacturing device for indicating the coating area.

Although the present invention has been described with respect to those printed circuit boards having a single wiring layer, the present invention is applicable to multi-layered printed circuit board having a number of wiring layers. The present invention is applicable not only to a camera module, but also to any other appropriate device.

Thus the present invention is not to be limited to the above embodiments but, on the contrary, various modifications will be possible without departing from the scope of claims appended hereto.

What is claimed is:

1. A printed circuit board comprising:
   a number of layers including a wiring layer formed with a circuit pattern and a covering layer covering said wiring layer,
      wherein at least a separate component may be affixed to said printed circuit board through an adhesive that is put on a designated coating area in a surface of said printed circuit board, and said coating area is marked by a differentiated layer structure at least in a border of said coating area; and
   a resistant layer formed to cover a part of said covering layer, said resistant layer being rigid and substantially equal in shape and size to said coating area, to mark said coating area as a rigid portion, whereas other portions exposing said covering layer are flexible,
      wherein said resistant layer is made of a material having a different color from other layers.

2. A printed circuit board comprising a number of layers including a wiring layer formed with a circuit pattern and a covering layer covering said wiring layer,
   wherein at least a separate component may be affixed to said printed circuit board through an adhesive that is put on a designated coating area in a surface of said printed circuit board, and said coating area is marked by a differentiated layer structure at least in a border of said coating area, and
   wherein said coating area is marked with perforations which are formed through at least one of said layers.

3. A printed circuit board as claimed in claim 1, wherein said perforations are arranged along the border of said coating area.

4. A printed circuit board as claimed in claim 1, wherein said perforations are formed through an outermost one of said layers.

5. A printed circuit board as claimed in claim 4, wherein said outermost layer is made of a material having a different color from other layers.

6. A printed circuit board as claimed in claim 1, further comprising a resistant layer formed to cover a part of said covering layer.

7. A printed circuit board as claimed in claim 6, wherein said perforations are arranged along the border of said coating area.

8. A printed circuit board as claimed in claim 6, wherein said perforations are formed through said resistant layer, and said resistant layer is made of a material having a different color from other layers.

* * * * *